US010103152B2

United States Patent
Kim et al.

(10) Patent No.: US 10,103,152 B2
(45) Date of Patent: Oct. 16, 2018

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Ji Hoon Kim, Gwacheon-si (KR); Eun Tae Kim, Seoul (KR); Seong Hun Park, Hwaseong-si (KR); Youn Jae Cho, Anyang-si (KR); Hee Sook Park, Hwaseong-si (KR); Woong Hee Sohn, Seoul (KR); Jin Ho Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/634,066

(22) Filed: Jun. 27, 2017

(65) Prior Publication Data
US 2018/0053769 A1 Feb. 22, 2018

(30) Foreign Application Priority Data

Aug. 17, 2016 (KR) .................. 10-2016-0104004

(51) Int. Cl.
*H01L 27/108* (2006.01)
*H01L 21/8242* (2006.01)
*H01L 29/423* (2006.01)

(52) U.S. Cl.
CPC .. *H01L 27/10876* (2013.01); *H01L 27/10814* (2013.01); *H01L 27/10823* (2013.01); *H01L 29/4236* (2013.01); *H01L 27/10855* (2013.01); *H01L 27/10891* (2013.01)

(58) Field of Classification Search
CPC ......... H01L 27/10823; H01L 27/10876; H01L 29/66621; H01L 29/7838; H01L 27/10814; H01L 29/4236; H01L 29/4958; H01L 29/4966
See application file for complete search history.

(56) References Cited

U.S. PATENT DOCUMENTS

| 6,156,382 A | 12/2000 | Rajagopalan et al. |
| 7,276,443 B2 | 10/2007 | Kim et al. |
| 8,278,201 B2 | 10/2012 | Jang |
| 8,513,116 B2 | 8/2013 | Khandelwal et al. |

(Continued)

FOREIGN PATENT DOCUMENTS

| JP | H08264530 A | 10/1996 |
| KR | 2003/0059489 A | 7/2003 |

(Continued)

OTHER PUBLICATIONS

Kodas et al., The Chemistry of Metal CVD, 1994.*

*Primary Examiner* — Julio J Maldonado
*Assistant Examiner* — Molly Reida
(74) *Attorney, Agent, or Firm* — Harness, Dickey, & Pierce, P.L.C.

(57) ABSTRACT

A Semiconductor device and method for fabricating the same are provided. The method includes forming a trench in a substrate, forming a lower gate metal using a first gas, the lower gate metal burying at least a portion of the trench, forming a barrier metal on the lower gate metal, on the barrier metal, forming an upper gate metal using a second gas different from the first gas and forming a capping film on the gate metal, the capping film filling the trench.

20 Claims, 15 Drawing Sheets

(56) References Cited

U.S. PATENT DOCUMENTS

| | | |
|---|---|---|
| 2012/0153381 A1 | 6/2012 | Song |
| 2015/0214362 A1 | 7/2015 | Oh |
| 2015/0287606 A1 | 10/2015 | Xu et al. |
| 2015/0349073 A1 | 12/2015 | Kang |
| 2016/0056160 A1 | 2/2016 | Jang et al. |
| 2016/0093717 A1 | 3/2016 | Oh |
| 2017/0125422 A1* | 5/2017 | Kang ............... H01L 27/10823 |

FOREIGN PATENT DOCUMENTS

| | | |
|---|---|---|
| KR | 100477813 B1 | 3/2005 |
| KR | 100972595 B1 | 7/2010 |
| KR | 101046727 B1 | 7/2011 |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2016-0104004 filed on Aug. 17, 2016 in the Korean Intellectual Property Office, and all the benefits accruing therefrom under 35 U.S.C. 119, the contents of which in its entirety are herein incorporated by reference.

BACKGROUND

The disclosure relates to a semiconductor device and a method for fabricating the same.

The buried channel array transistor (BCAT) includes gate electrodes buried in trenches, and thus can reduce the impact from short channel effect associated with DRAM structure.

Meanwhile, the ultra large scale integration of DRAM device has continuously reduced the amount, or quantity of charge charged in the capacitor. Accordingly, along with efforts to increase the quantity of charge stored in the capacitor, it is also important to provide leakage current control so as to enhance driving efficiency of the device and the performance thereof.

One of the leakage current in DRAM cell is from leakage current in a gate off state between a gate and a highly-doped storage node, or BC node. Such leakage can be called gate induced drain leakage (GIDL). Accordingly, it is desirable to improve the refresh time (tREF) by controlling such leakage current.

SUMMARY

It is one technical object of the disclosure to provide a semiconductor device with improved operating characteristics.

It is another technical object of the disclosure to provide a method for fabricating a semiconductor device with improved operating characteristics.

The objects according to the disclosure are not limited to those set forth above and objects other than those set forth above will be clearly understood to a person skilled in the art, from the following description.

According to example embodiments of inventive concepts, there is provided a method for fabricating a semiconductor device, comprising forming a trench in a substrate, forming a lower gate metal using a first gas, the lower gate metal burying at least a portion of the trench, forming a barrier metal on the lower gate metal, on the barrier metal, forming an upper gate metal using a second gas different from the first gas and forming a capping film on the gate metal, the capping film filling the trench.

According to other example embodiments of inventive concepts, there is provided a method for fabricating a semiconductor device, comprising forming a device isolation film for defining an active region in a substrate, forming a trench in the active region, forming a gate electrode to bury a portion of the trench, the gate electrode comprising a lower gate metal, a barrier metal, and an upper gate metal, on the gate electrode, forming a capping film for filling the trench and forming a source/drain region in at least one side of the trench, wherein forming the gate electrode comprises, forming a lower gate metal using $B_2H_6$ gas, forming a barrier metal on the lower gate metal, and forming an upper gate metal on the barrier metal, by using $SiH_4$ gas.

According to other example embodiments of the inventive concepts, there is provided A method for fabricating a semiconductor device on a substrate, comprising forming a lower barrier metal on a trench of the substrate, forming a lower gate metal on the lower barrier metal using a first gas, forming an upper barrier metal on the lower gate metal, and on the upper barrier metal, forming an upper gate metal using a second gas different from the first gas.

BRIEF DESCRIPTION OF THE DRAWINGS

The above and other objects, features and advantages of the disclosure will become more apparent to those of ordinary skill in the art by describing in detail example embodiments thereof with reference to the accompanying drawings, in which.

DETAILED DESCRIPTION

A semiconductor device according to some example embodiments will be explained with reference to FIGS. 1 and 2.

Figure 1:
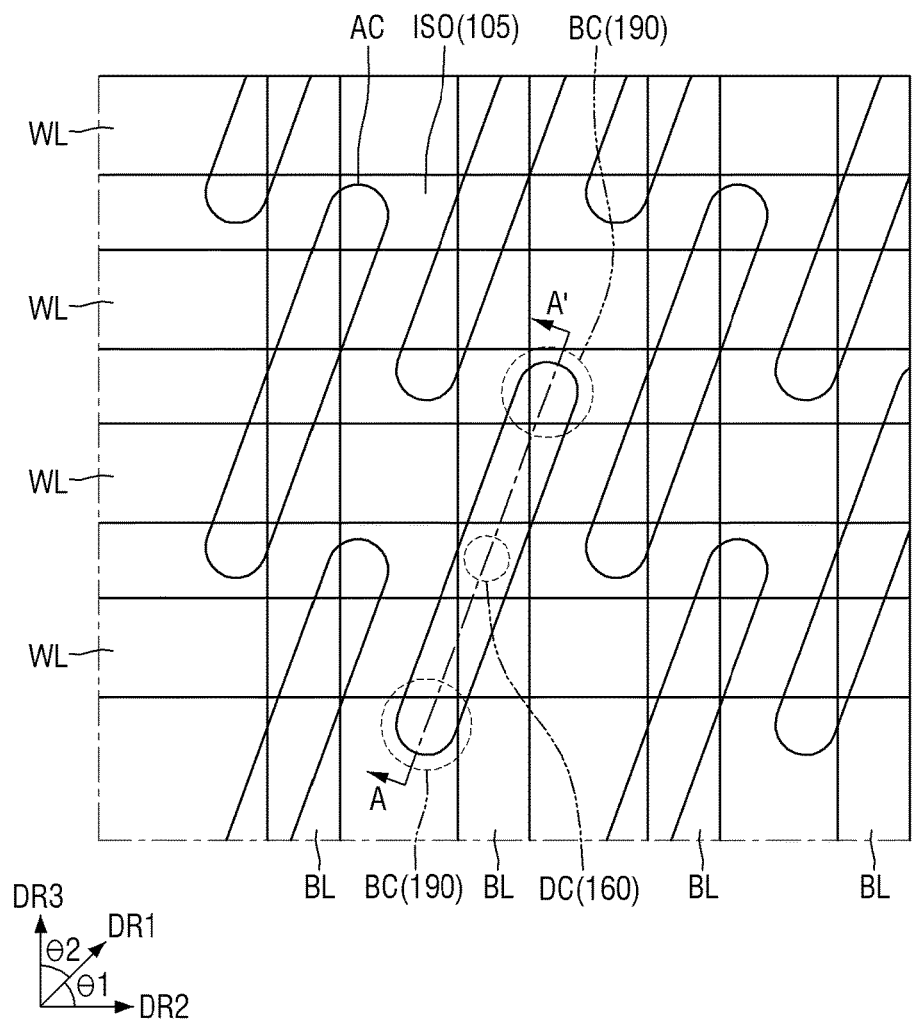
FIG. 1 is a layout diagram provided to explain a semiconductor device according to some example embodiments.
Figure 2:
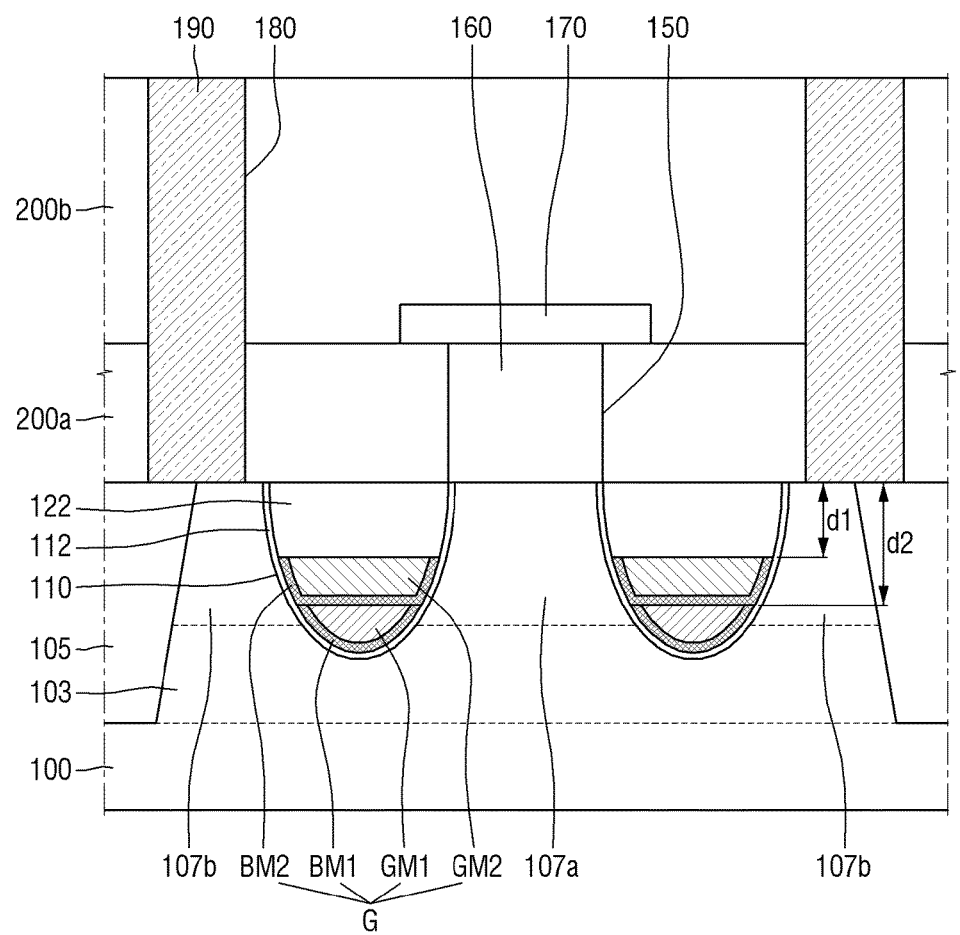
FIG. 2 is a cross sectional view taken on line A-A' of FIG. 1.

FIG. 1 is a layout diagram provided to explain a semiconductor device according to some example embodiments, and FIG. 2 is a cross sectional view taken on line A-A' of FIG. 1.

Referring to FIGS. 1 and 2, a semiconductor device according to some example embodiments includes a substrate 100, an active region AC, a device isolation region ISO, a word line WL, and a bit line BL.

The substrate 100 may be a bulk silicon or a silicon-on-insulator (SOI), for example. Alternatively, the substrate 100 may be a silicon substrate, or may include other material such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The active region AC is defined as the boundary around the device isolation region ISO in the substrate 100. The active region AC may have a shape of an isolated island having a first direction DR1 as a length direction. To explain the above in detail, the active region AC is formed by extending in the first direction DR1; a gate electrode (e.g., word line WL) is formed by extending in a second direction DR2 at a first acute angle ($\theta 1$) with the first direction DR1; and a bit line BL is formed by extending in a third direction DR3 at a second acute angle ($\theta 2$) with the first direction DR1. The inventive concepts are not limited to islands. For example, the active region AC may extend the length of a subarray.

As used herein, the "angle" in the statement that reads, "a certain direction is at an angle with a certain different direction", refers to a smaller angle when two angles are formed between two directions intersecting each other. For example, the "angle" refers to 60°, when 120° and 60° are the angles that can be made between two intersecting directions. Accordingly, as illustrated in FIG. 1, the angle between the first direction DR1 and the second direction DR2 is θ1, and the angle between the first direction DR1 and the third direction DR3 is θ2.

As described above, angles θ1 and/or θ2 are made acute angles because it is desirable to ensure a large distance between a bit line contact 160 connecting the active region AC with the bit line BL, and a storage node contact 190 connecting the active region AC with storage node. For example, θ1 and θ2 may each be 45° and 45°, or 30° and 60°, or 60° and 30°, but the inventive concepts are not limited thereto.

Each active region AC includes a first contact region DC on a top surface of a center portion, and a second contact region BC on top surfaces of opposing edges, respectively. That is, the first contact region DC becomes a region to electrically connect with the bit line BL, and the second contact region BC becomes a region to electrically connect with a storage node. Each of the active regions AC neighboring in the second direction may be formed such that the second contact regions BC are disposed adjacent to each other. The first contact region DC and the second contact region BC in each active region AC do not have an overlapping portion with each other, and each has an isolated region.

A device isolation film 105 may be formed in the device isolation region ISO. The device isolation film 105 may include silicon oxide. Alternatively, the device isolation film 105 may have a structure in which at least one or more layers of each of silicon oxide and silicon nitride are stacked. An inner width of the device isolation region ISO may vary depending on a location where the device isolation region ISO is formed, and the stack structure of the device isolation film 105 filling an interior of the device isolation region ISO may vary depending on the inner width of the device isolation region ISO.

Referring to FIG. 2, a semiconductor device according to some example embodiments may include a substrate 100, an active region 103, a device isolation film 105, a trench 110, a gate electrode G, a storage node contact 190, and/or other structures.

The substrate 100 may be a structure in which a base substrate and an epitaxial layer are stacked, although example embodiments are not limited thereto. The substrate 100 may be a silicon substrate, a gallium arsenide substrate, a silicon germanium substrate, a ceramic substrate, a quartz substrate, or a glass substrate for display, or a semiconductor on insulator (SOI) substrate. Below, a silicon substrate will be described as an example.

The device isolation film 105 is formed in the substrate 100, defining the active region 103. The device isolation film 105 may be formed with a shallow trench isolation (STI) structure that is advantageous for high integration due to superior device isolation property thereof and small occupied area, although example embodiments are not limited thereto. For example, the device isolation film 105 may include at least one of silicon oxide, silicon nitride, silicon oxynitride, and a combination thereof. The device isolation film 105 may be formed using a spin-on dielectric (SOD), and/or a high density plasma d process (HDP), and/or similar processes.

The trench 110 is formed within the substrate 100 in the active region 103. The trench 110 may have several shapes. For example, as illustrated, the trench 110 may have a shape in which a connecting portion between a bottom surface and a sidewall is round. Alternatively, the trench 110 may have a shape in which a sidewall is inclined at a predetermined angle.

A gate insulating film 112 may each be formed conformally along the inner wall of the trench 110. For example, the gate insulating film 112 may include silicon oxide, silicon nitride, or silicon oxynitride, or a high-k dielectric material. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but inventive concepts are not limited thereto.

The gate insulating film 112 may be formed along the bottom surface and an entirety of the side surfaces of the trench 110. That is, the inner wall of the trench 110 may be substantially covered by the gate insulating film 112. However, example embodiments are not limited to the example given above. The gate insulating film 112 may be formed with an in-situ steam generation (ISSG) process, and/or with a thermal oxidation process, and/or similar processes.

The gate electrode G may be formed by burying at least a portion of the trench 110 in which the gate insulating film 112 is formed. That is, the gate electrode G may be in a recessed form. An upper surface of the gate electrode G may each be lower than an upper surface (surface) of the substrate 100. The gate electrode G may include a conductive material such as a metal, for example. The gate electrode G in FIG. 2 is the same element as the word line WL in FIG. 1, but referred to by different symbols for convenience of explanation.

Specifically, the gate electrode G may include a lower barrier metal BM1, a lower gate metal GM1, an upper barrier metal BM2, and an upper gate metal GM2.

The lower barrier metal BM1 may be formed on the gate insulating film 112. The lower barrier metal BM1 may be formed conformally along a portion of the upper surface of the gate insulating film 112. The lower barrier metal BM1 may be formed along the bottom surface and a portion of the side surfaces of the trench 110. That is, the lower barrier metal BM1 may be formed along a portion of both side surfaces with reference to the bottom surface of the trench 110. The lower barrier metal BM1 may include at least one of titanium nitride (TiN), tantalum nitride (TaN), titanium (Ti), tantalum (Ta), molybdenum (Mo), and aluminum (Al).

The lower gate metal GM1 may be formed on the lower barrier metal BM1. The lower gate metal GM1 may partially fill the trench 110. That is, the lower gate metal GM1 may be formed to reach a location to correspond to a location at which the lower barrier metal BM1 is formed. Accordingly, the height of the upper surface of the lower gate metal GM1 and the height of the upper surface of the lower barrier metal BM1 may be substantially the same.

The upper barrier metal BM2 may be formed on the lower barrier metal BM1 and the lower gate metal GM1. The lower barrier metal BM1 may be formed conformally along upper surfaces of the lower barrier metal BM1 and the lower gate metal GM1, and along a portion of the side surfaces of the gate insulating film 112. That is, the upper barrier metal BM2 may be formed along a portion of both side surfaces of the trench 110 with reference to the upper surfaces of the lower barrier metal BM1 and the lower gate metal GM1.

The upper barrier metal BM2 may include at least one of TiN, TaN, Ti, Ta, Mo, and Al. The upper barrier metal BM2 may include the same material as the lower barrier metal BM1. The upper barrier metal BM2 may have a substantially identical property as the lower barrier metal BM1. In the example mentioned above, a border between the lower barrier metal BM1 and the upper barrier metal BM2 may not be distinctive.

The upper gate metal GM2 may be formed on the upper barrier metal BM2. The upper gate metal GM2 may partially fill the trench 110. That is, the upper gate metal GM2 may be formed to reach a location to correspond to a location at which the upper barrier metal BM2 is formed. Accordingly, the height of the upper surface of the upper gate metal GM2 and the height of the upper surface of the upper barrier metal BM2 may be substantially the same.

Both the upper gate metal GM2 and the lower gate metal GM1 may include tungsten (W). However, the upper gate metal GM2 and the lower gate metal GM1 may have different properties from each other. Specifically, the lower gate metal GM1 may have a higher boron content than the upper gate metal GM2. This may be attributed to the process of forming the upper gate metal GM2 and the lower gate metal GM1.

Both the upper gate metal GM2 and the lower gate metal GM1, which include tungsten (W) with characteristics such as superior thermal stability, low resistance, and so on, may use chemical vapor deposition (CVD) or atomic layer deposition (ALD). Generally, the CVD tungsten process may involve reaction between precursor and gas for the deposition. The precursor used in such process may be a source gas containing W such as tungsten hexafluoride ($WF_6$), tungsten hexachloride ($WCl_6$) and so on.

The reaction between the precursor and the gas causes reduction and formation of W, and W formed as a result of this may vary depending on the types of the gas. This is because the type of impurity included in the resulted W and an amount thereof may vary.

Specifically, the lower gate metal GM1 may be deposited as a result of reaction between diborane ($B_2H_6$) gas and the precursor. For W deposition, the general process involves forming an initial thin film with a gas with high reactivity, and growing the same with a gas with low reactivity. Accordingly, for the lower gate metal GM1, an initial thin film may be formed using $B_2H_6$ gas, and then completed using diatomic hydrogen ($H_2$) gas with a relatively lower reactivity.

On the other hand, the upper gate metal GM2 may be deposited as a result of reaction between silane ($SiH_4$) gas and precursor. The upper gate metal GM2 may likewise involve the process of forming an initial thin film with a highly-reactive gas, and then growing the film with a less-reactive gas, and accordingly, for the upper gate metal GM2, $SiH_4$ gas may be used for forming an initial thin film, and $H_2$ gas with a relatively lower reactivity may then be used for completing forming the film.

As a result, the upper gate metal GM2 may have a lower boron concentration than the lower gate metal GM1. Further, the boron concentration of the lower barrier metal BM1 may be higher than the boron concentration of the upper barrier metal BM2. This is because an amount of boron diffused in the lower gate metal GM1 is greater in the lower barrier metal BM1 than the upper barrier metal BM2. Specifically, the differences in the boron concentration are particularly prominent, when comparing the side surface of the lower barrier metal BM1 with the side surface of the upper barrier metal BM2 (that is, excluding the bottom surface of the upper barrier metal BM2).

The upper gate metal GM2 and the lower gate metal GM1 may have differences in the effective work function (eWF) according to differences in the fabricating method described above. For example, the upper gate metal GM2 may have a relatively lower or higher effective work function than the lower gate metal GM1.

Further, the upper gate metal GM2 and the lower gate metal GM1 may also have a difference in the resistivity according to differences in the fabricating method described above. For example, the upper gate metal GM2 may have a relatively higher or lower resistivity than the lower gate metal GM1.

The vertical distance d1 between the upper gate metal GM2 and the BC node, i.e., with the storage node contact 190 may be less than the vertical distance d2 between the lower gate metal GM1 and the storage node contact 190. Further, the shortest distance may be similar to the case of the vertical distances. That is, the upper gate metal GM2 may be closer to the storage node contact 190 than the lower gate metal GM1.

Among the properties described above, the effective work function is associated with the leakage current. That is, high work function may involve a risk of increased leakage current with the BC node. Accordingly, the leakage current may be significantly reduced and the efficiency of the semiconductor device may be enhanced, by forming an upper portion of the gate metal, which is closer to the BC node, with a material of lower effective work function.

Note that, because the gate electrode G is the word line WL in FIG. 1, a lower resistance may be advantageous, when considering transmission of electrical signal. Accordingly, when the lower gate metal GM1 has the property of relatively lower resistance, the efficiency of the semiconductor device can be maintained on another aspect.

That is, a semiconductor device according to some example embodiments can have optimized leakage current and resistance characteristics by means of a double-structured gate metal having a plurality of work functions. As a result, the semiconductor device can have significantly enhanced operating performance.

A first capping film 122 may be formed by burying the rest of the trench 110 after the gate electrode G is formed. The first capping film 122 may include at least one of, for example, silicon oxide, silicon nitride, and silicon oxynitride. The first capping film 122 may be formed by a chemical vapor deposition process and/or similar processes.

A first source/drain region 107a may be formed between two gate electrodes G. A second source/drain region 107b may be formed between the gate electrode G and the device isolation film 105. That is, two transistors may be formed in the active region 103, in which case the first source/drain region 107a is shared by two adjacent transistors, and the second source/drain region 107b is not shared by the two adjacent transistors.

The first source/drain region 107a and the second source/drain region 107b may include a silicide region on an upper portion. The silicide region may include a metal silicide compound. As a result, the electric connections between the bit line contacts 160 and the storage node contacts 190 may be formed with low resistance, respectively.

A first interlayer insulating film 200a may be formed on the substrate 100, overlying the gate electrode G and the device isolation film 105. For example, the first interlayer insulating film 200a may include at least one of silicon oxide, silicon nitride and silicon oxynitride. The first interlayer insulating film 200a may be a single layer or multi-layers.

The first interlayer insulating film 200a includes a first contact hole 150 that exposes the first source/drain region 107a. That is, the first contact hole 150 may be passed through the first interlayer insulating film 200a.

The bit line contact 160 may be formed in the first contact hole 150. The bit line contact 160 may include a conductive material such as at least one of polysilicon, metal silicide compound, conductive metal nitride, and metal, for example, although example embodiments are not limited thereto.

A bit line 170, which is electrically connected with the bit line contact 160, may be formed on the bit line contact 160. The bit line 170 may include a conductive material such as at least one of polysilicon, metal silicide compound, conductive metal nitride, and metal, for example, although example embodiments are not limited thereto. The bit line 170 in FIG. 2 is the same element as the bit line BL in FIG. 1, but referred to by different symbols for convenience of explanation.

A second interlayer insulating film 200b may be formed on the first interlayer insulating film 200a, overlying the bit line 170. For example, the second interlayer insulating film 200b may include at least one of silicon oxide, silicon nitride and silicon oxynitride. The second interlayer insulating film 200b may be a single layer or multi-layers.

A second contact hole 180 may be passed through the first interlayer insulating film 200a and the second interlayer insulating film 200b, thus exposes the second source/drain region 107b.

The storage node contact 190 may be formed in the second contact hole 180. The storage node contact 190 may be electrically connected with the second source/drain region 107b. The storage node contact 190 may include a conductive material such as at least one of polysilicon, metal silicide compound, conductive metal nitride, and metal, for example, although example embodiments are not limited thereto.

An information storing element may be formed on the storage node contact 190. The information storing element formed on the storage node contact 190 may be a capacitor, for example, or may include a storage node in contact with the storage node contact 190. Alternatively, the information storing element may be a variable resistor. The information storing element may include a phase change material and/or may be a magnetic tunnel junction pattern.

A method for fabricating a semiconductor device according to some example embodiments will be described with reference to FIGS. 1 to 23. In the following description, description overlapped with the example embodiments already provided above will not be described or described as brief as possible for the sake of brevity.

FIGS. 3 to 23 are views illustrating intermediate stages of fabrication, provided to explain a method for fabricating a semiconductor device according to some example embodiments.

Figure 3:
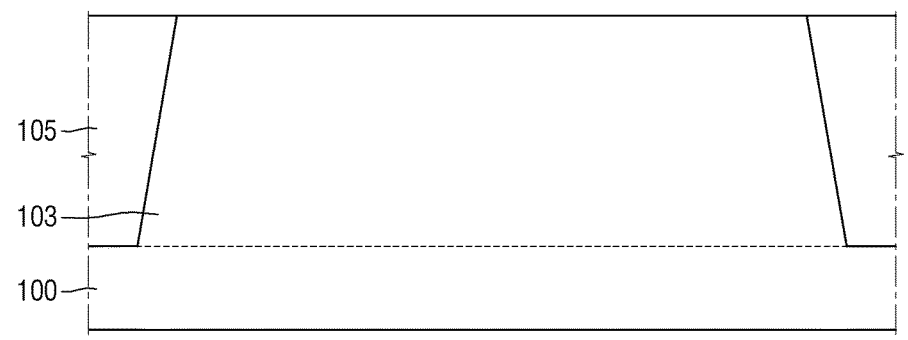
FIGS. 3 to 23 are views illustrating intermediate stages of fabrication, provided to explain a method for fabricating a semiconductor device according to some example embodiments.

Referring to FIGS. 1 and 3, a device isolation film 105 is formed on the substrate 100.

Forming the device isolation film 105 may define the active region AC and the device isolation region ISO in FIG. 1. Specifically, the active region AC in FIG. 1 may be illustrated to be the active region 103 in FIG. 3, and the device isolation region ISO in FIG. 1 may be illustrated to be the device isolation film 105 in FIG. 3.

Figure 4:
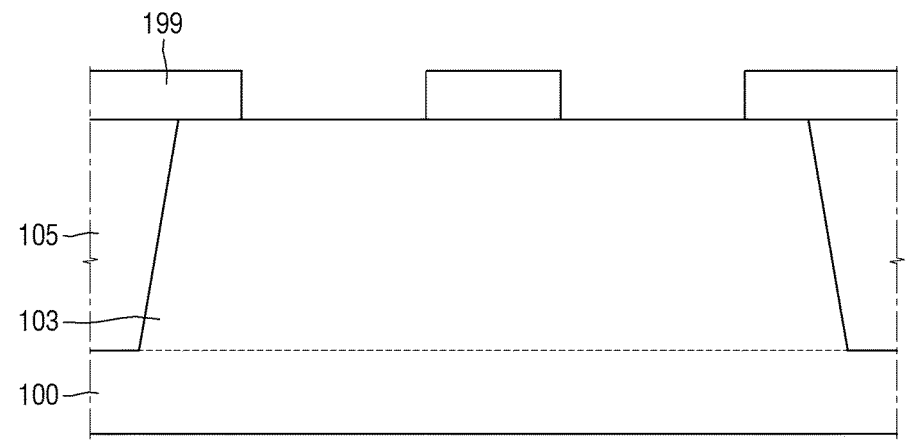

Next, referring to FIGS. 1, 2 and 4, a mask pattern 199 is formed on the substrate 100.

The mask pattern 199 exposes a region where the trench 110 is to be formed. The mask pattern 199 may be oxide film, nitride film, oxynitride film, and so on, but the inventive concepts are not limited thereto. The region where the trench 110 is to be formed will later be the active region AC portion where the word line WL or the gate electrode G (FIG. 2) is formed, and it is not the device isolation region ISO. However, the example embodiments are not limited to any of the specific examples given above. Accordingly, when a dummy gate electrode is formed in the device isolation region ISO, the device isolation film 105 may also be exposed by the mask pattern 199.

Figure 5:
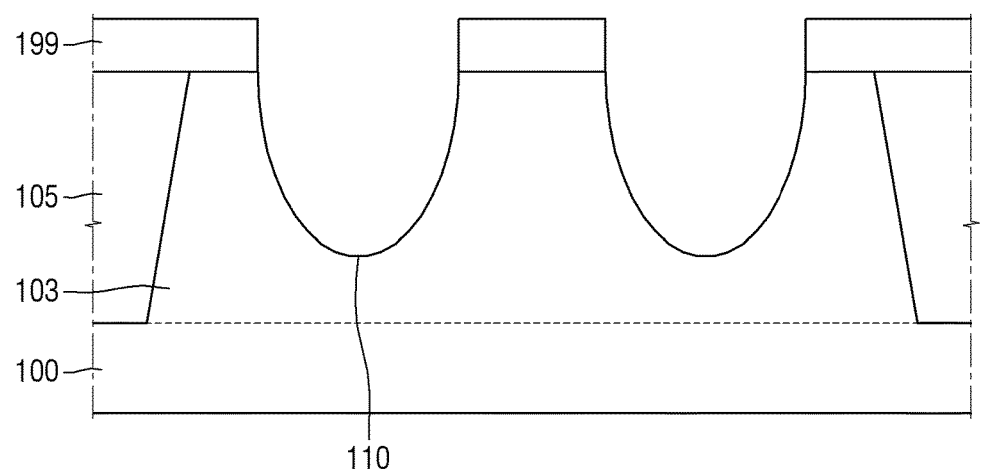

Next, referring to FIG. 5, the trench 110 is formed in the portion where the mask pattern 199 is not formed. In this process, the trench may be additionally formed in the device isolation film 105.

The trench 110 may have several shapes. For example, as illustrated, the trench 110 may have a shape in which a connecting portion between a bottom surface and a sidewall is round. Alternatively, the trench 110 may have a shape in which a sidewall is inclined at a predetermined angle.

Figure 6:
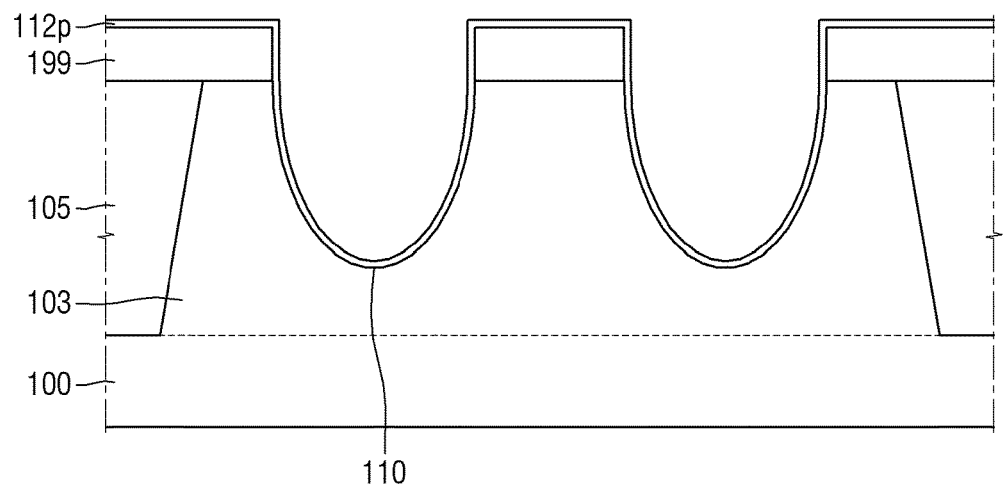

Next, referring to FIG. 6, an insulating film 112p is formed on an upper surface of the trench 110 and an upper surface of the mask pattern 199.

The insulating film 112p is formed conformally inside the trench 110 and on the upper surface of the mask pattern 199. For example, the insulating film 112p may include silicon oxide, silicon nitride, or silicon oxynitride, or a high-k dielectric material. The insulating film 112p may later become the gate insulating film 112.

Figure 7:
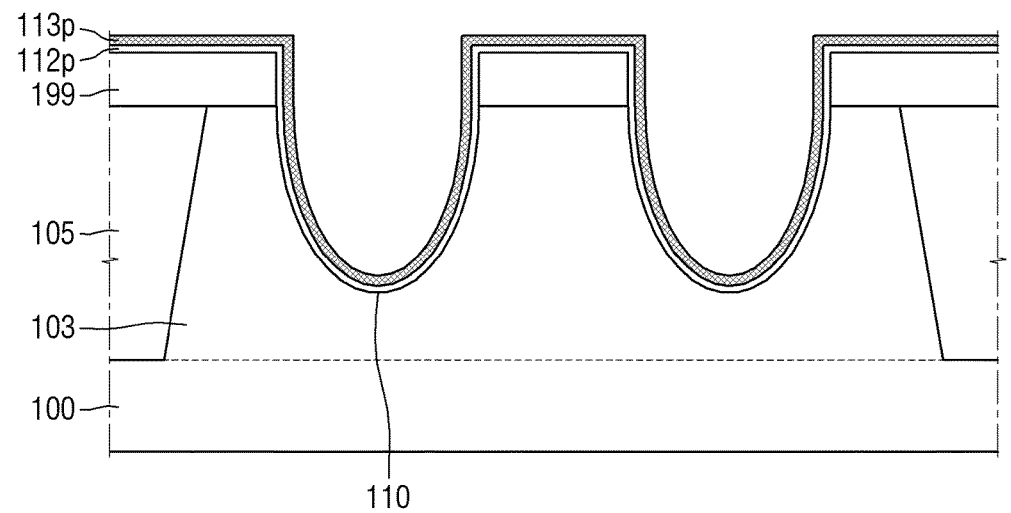

Next, referring to FIGS. 2 and 7, a first barrier metal film 113P is formed.

The first barrier metal film 113P may be formed on the insulating film 112p. The first barrier metal film 113P may be formed conformally along the upper surface of the insulating film 112p. The first barrier metal film 113P may include at least one of TiN, TaN, Ti, Ta, Mo, and Al. The first barrier metal film 113P may later become the lower barrier metal BM1.

Figure 8:
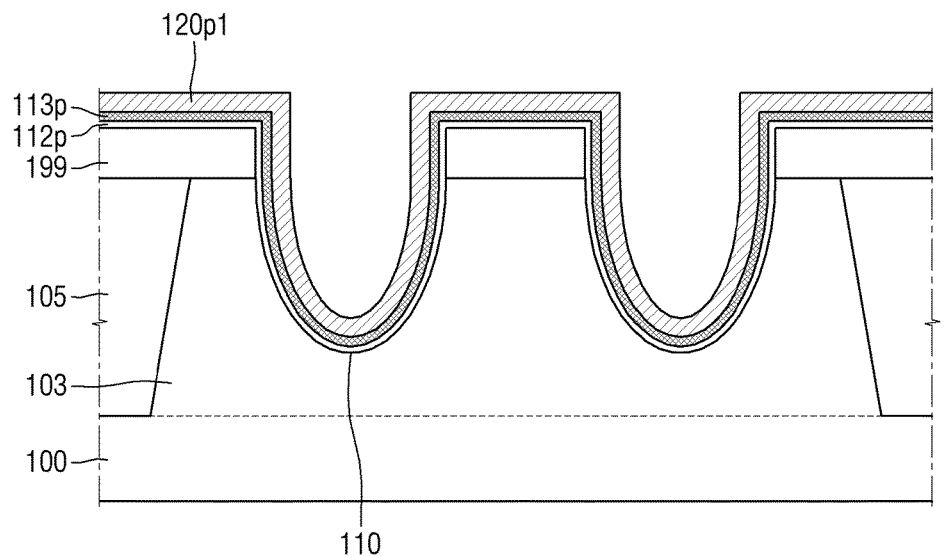

Next, referring to FIG. 8, a lower gate thin film 120p1 is formed.

The lower gate thin film 120p1 may be formed on the first barrier metal film 113P. The lower gate thin film 120p1 may be formed as a result of reduction reaction between a precursor such as $WF_6$ or $WCl_6$ and $B_2H_6$. The lower gate thin film 120p1, which is an initial thin film, may be formed by using $B_2H_6$ gas with high reactivity.

Figure 9:
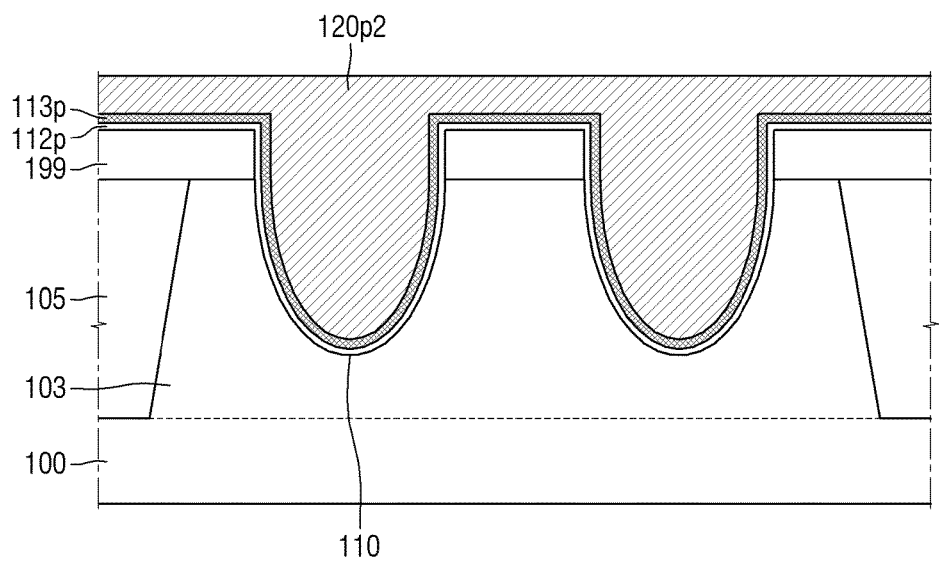

Next, referring to FIG. 9, a lower gate material film 120p2 is formed.

The lower gate material film 120p2 may be formed by continuously growing the lower gate thin film 120p1. The lower gate material film 120p2 may fill up the trench 110. Moreover, the lower gate material film 120p2 may fill beyond the trench 110 to overlie the upper surface of the first barrier metal film 113P.

The lower gate material film 120p2 may be formed as a result of reduction reaction between a precursor such as $WF_6$ or $WCl_6$ and $H_2$. $H_2$ gas may have a lower reactivity than $B_2H_6$ gas. The lower gate material film 120p2 may later become the lower gate metal GM1. That is, the lower gate material film 120p2 may be a conductor containing tungsten (W).

Figure 10:
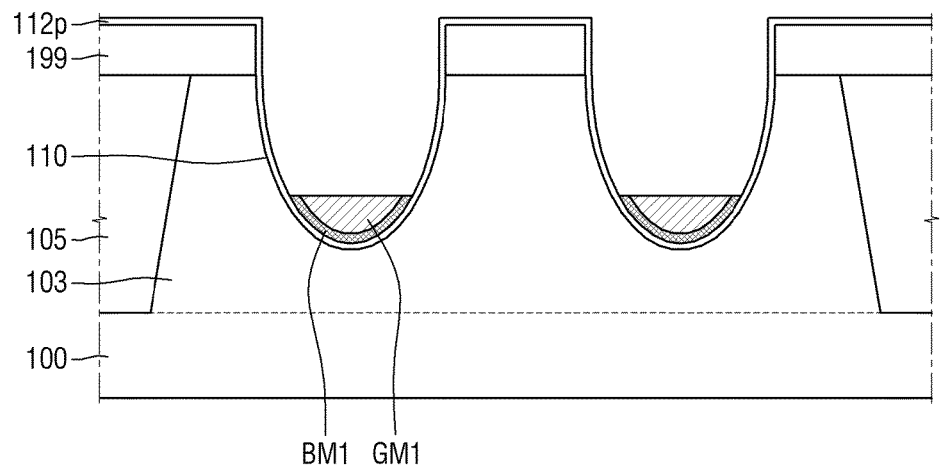

Next, referring to FIGS. 9 and 10, a lower barrier metal BM1 and a lower gate metal GM1 are formed.

The first barrier metal film 113P in FIG. 9 may be formed into the lower barrier metal BM1, and the lower gate material film 120p2 in FIG. 9 may be formed into the lower gate metal GM1.

The lower barrier metal BM1 and the lower gate metal GM1 may be in a recessed form that only partially fills the trench 110. The upper surfaces of the lower barrier metal BM1 and the lower gate metal GM1 may be lower than the upper surface (surface) of the substrate 100.

The lower barrier metal BM1 and the lower gate metal GM1 may be formed as a result of etching the first barrier metal film 113P and the lower gate material film 120p2. The etching mentioned above may be an etch back process, for example.

Although it is described above that the lower barrier metals BM1 and the lower gate metal GM1 are formed simultaneously, example embodiments are not limited thereto. The lower barrier metal BM1 and the lower gate metal GM1 may be formed respectively at separate time points.

Figure 11:
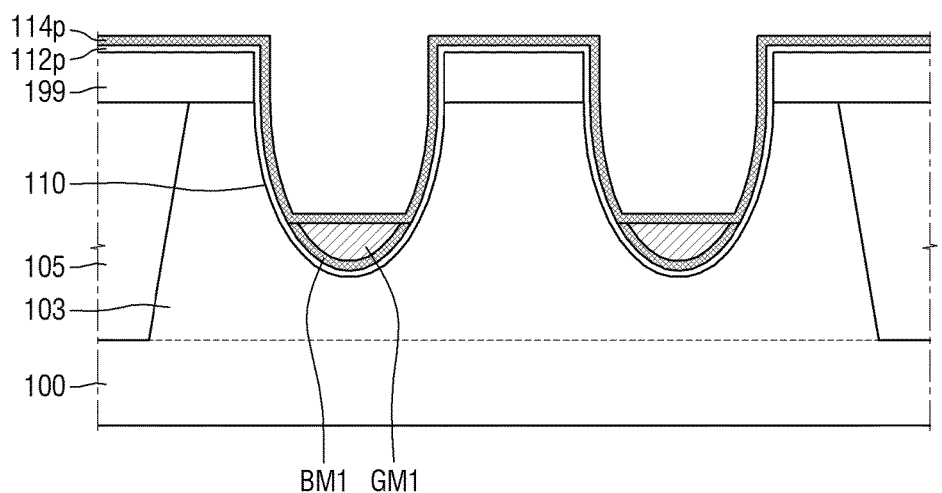

Next, referring to FIGS. 2 and 11, a second barrier metal film 114p is formed.

The second barrier metal film 114p may be formed on the insulating film 112p, the lower barrier metal BM1, and the lower gate metal GM1. The second barrier metal film 114p may be formed conformally along the upper surfaces of the insulating film 112p, the lower barrier metal BM1, and the lower gate metal GM1. The second barrier metal film 114p may include at least one of TiN, TaN, Ti, Ta, Mo, and Al. The second barrier metal film 114p may include the same material as the lower barrier metal BM1. The second barrier metal film 114p may later become an upper barrier metal BM2.

Figure 12:
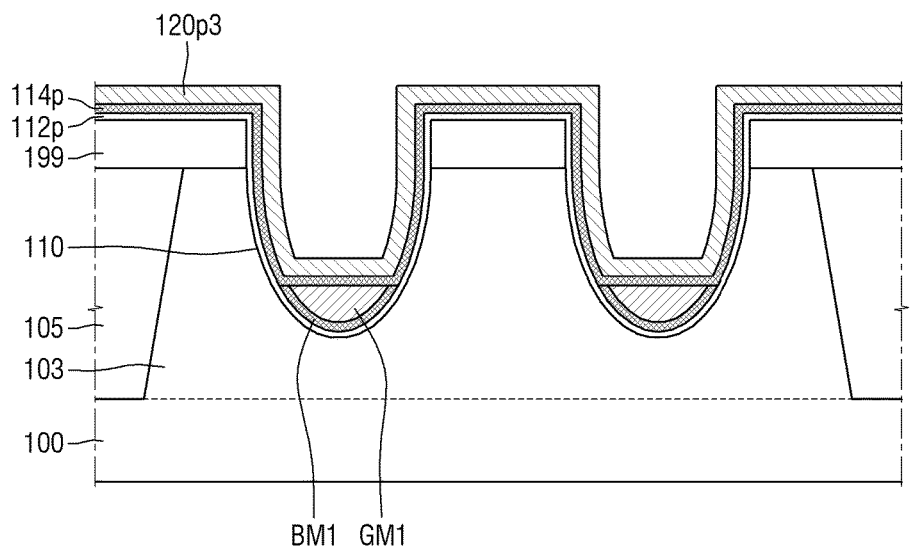

Next, referring to FIG. 12, an upper gate thin film 120p3 is formed.

The upper gate thin film 120p3 may be formed on the second barrier metal film 114p. The upper gate material film 120p3 may be formed as a result of reduction reaction between a precursor such as $WF_6$ or $WCl_6$ and $SiH_4$. The upper gate thin film 120p3, which is an initial thin film, may be formed by using $SiH_4$ gas with high reactivity. The inventive concepts are not limited thereto, and other gases may be used. For example, thin films may be formed using disilane ($Si_2H_6$) gas.

Figure 13:
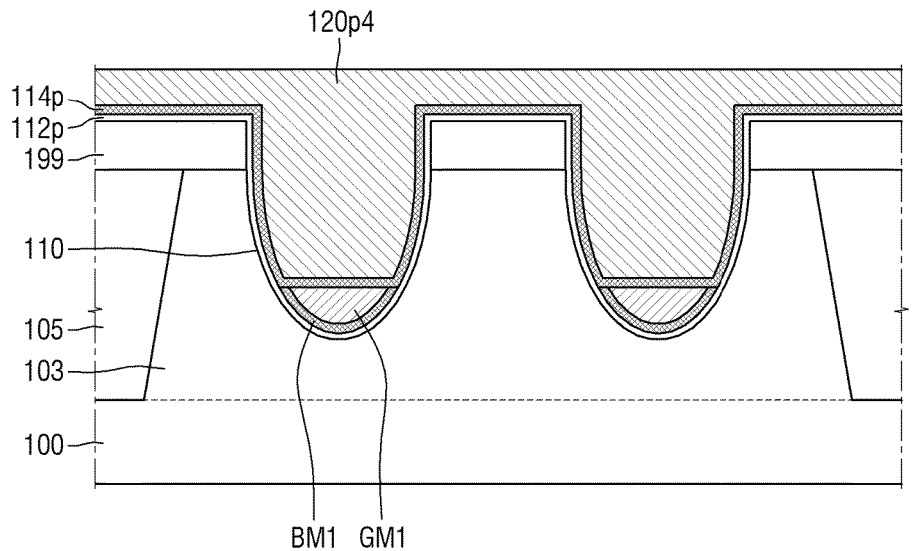

Next, referring to FIG. 13, an upper gate material film 120p4 is formed.

The upper gate material film 120p4 may be formed by continuously growing the upper gate thin film 120p3. The upper gate material film 120p4 may fill up the trench 110. Moreover, the upper gate material film 120p4 may fill beyond the trench 110 to overlie the upper surface of the second barrier metal film 114p.

The upper gate material film 120p4 may be formed as a result of reduction reaction between a precursor such as $WF_6$ or $WCl_6$ and $H_2$. $H_2$ gas may have a lower reactivity than $B_2H_6$ gas. The upper gate material film 120p4 may later become the upper gate metal GM2. That is, the upper gate material film 120p4 may be a conductor containing tungsten (W).

Compared to the lower gate metal GM1, the upper gate material film 120p4 may have a higher resistance and a lower effective work function. Further, the upper gate material film 120p4 may have a lower boron content.

Figure 14:
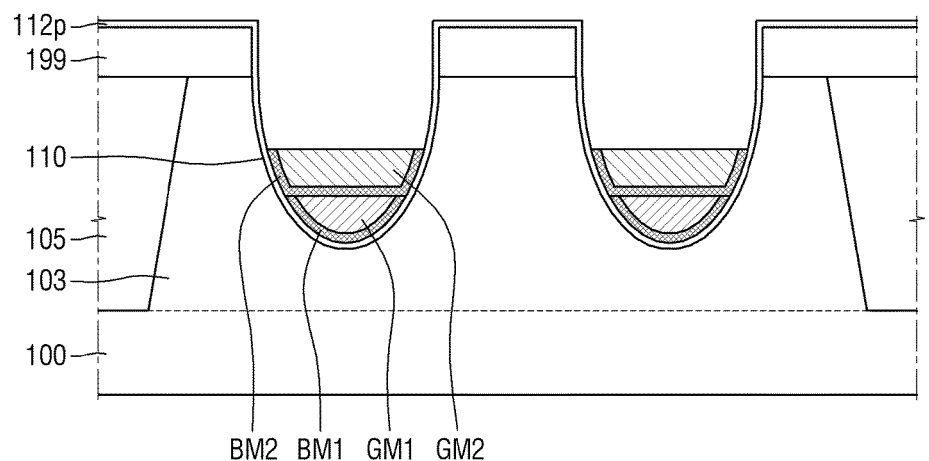

Next, referring to FIGS. 13 and 14, a lower barrier metal BM1 and a lower gate metal GM1 are formed.

The second barrier metal film 114p in FIG. 13 may be formed into the upper barrier metal BM2, and the upper gate material film 120p4 in FIG. 13 may be formed into the upper gate metal GM2.

The upper barrier metal BM2 and the upper gate metal GM2 may be in a recessed form that only partially fills the trench 110. The upper surfaces of the upper barrier metal BM2 and the upper gate metal GM2 may be lower than the upper surface (surface) of the substrate 100.

The upper barrier metal BM2 and the upper gate metal GM2 may be formed as a result of etching the second barrier metal film 114-p and the upper gate material film 120p4. The etching mentioned above may be an etch back process, for example.

Although it is described above that the upper barrier metal BM2 and the upper gate metal GM2 are formed simultaneously, example embodiments are not limited thereto. The upper barrier metal BM2 and the upper gate metal GM2 may be formed respectively at separate time points.

Figure 15:
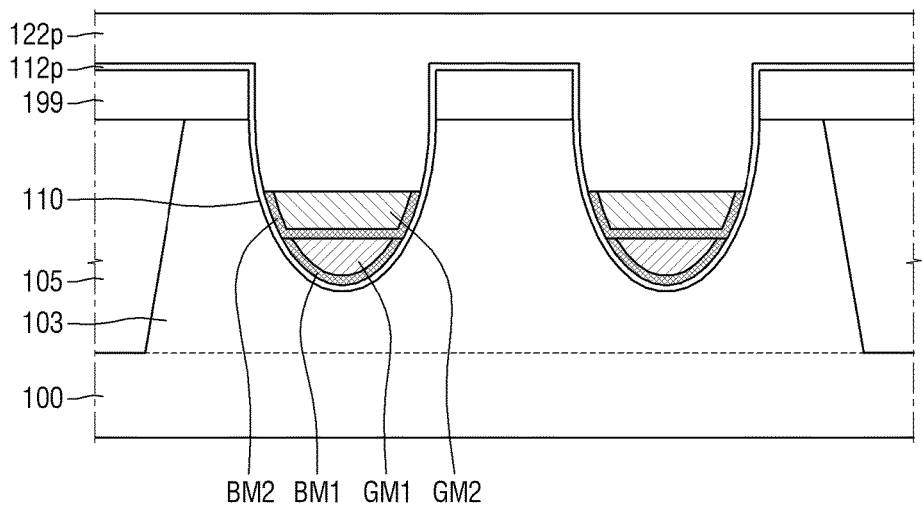

Next, referring to FIG. 15, a capping material 122p is formed.

The capping material 122p may be formed on the insulating film 112p, the upper barrier metal BM2, and the upper gate metal GM2. The capping material 122p may fill up the trench 110. Moreover, the capping material 122p may fill beyond the trench 110 to overlie the upper surface of the insulating film 112p.

The capping material 122p may be oxide film, nitride film, oxynitride film, and so on, but not limited thereto.

Figure 16:
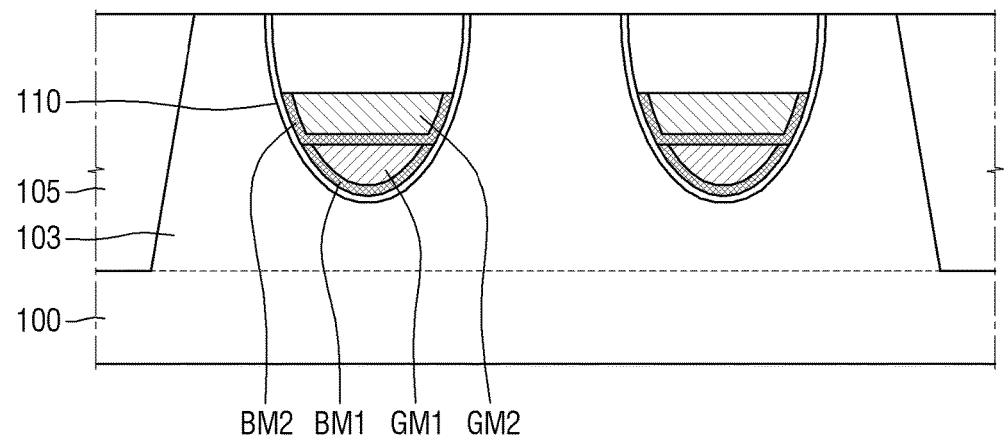

Referring to FIG. 16, the capping material 122p, the insulating film 112p, and the mask pattern 199 are etched.

As a result, the upper surface of the substrate 100 may be exposed. In this example, the etching may use the chemical mechanical polishing (CMP) manner. Accordingly, the capping material 122p may form the capping film 122, and the insulating film 112p may form the gate insulating film 112. The gate insulating film 112 may each be formed in the trench 110 only.

In this example, the exposed upper surfaces of the capping film 122, the gate insulating film 112, the active region 103, and the device isolation film 105 may all be present in the same plane. The "same plane" as used herein refers to a plane that is planarized through the same process and that includes minute irregularities that may occur during the process.

The mask pattern 199 may be removed. The time the mask pattern 199 is removed is not limited, that is, the time may be varied. That is, in some example embodiments, the mask pattern 199 may be removed first, after which the insulating film 112p, the gate electrode G, and so on may be formed.

Figure 17:
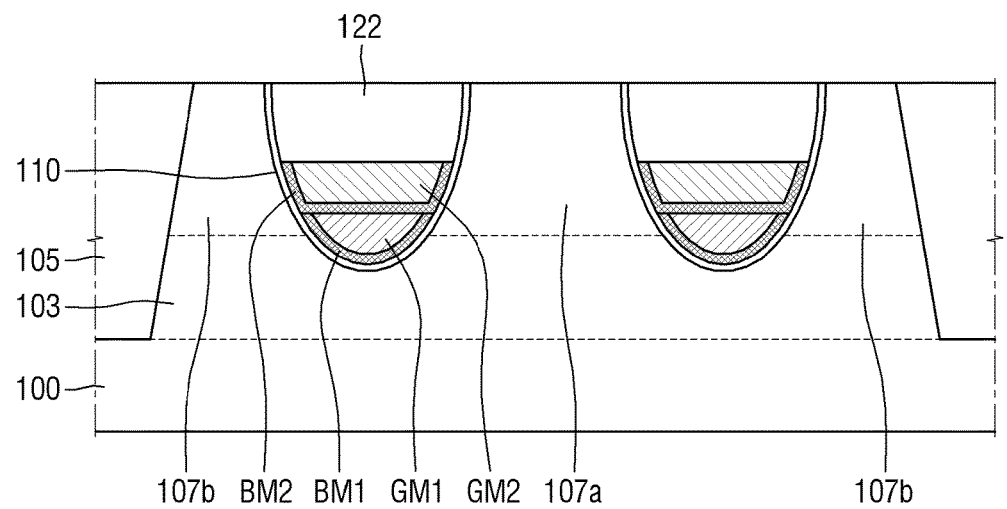

Next, referring to FIG. 17, the first source/drain region 107a and the second source/drain region 107b are formed in the active region 103.

For a semiconductor device that is an N-type transistor, the first source/drain region 107a and the second source/drain region 107b may be doped with N-type impurity and formed. The first source/drain region 107a and the second source/drain region 107b may be formed with a beamline implantation process, and/or a plasma assisted doping process, and/or similar processes. The first source/drain region 107a is between the trenches 110 in the substrate 100. The second source/drain region 107b is each disposed between the trench 110 and the device isolation film 105 in the substrate 100. In this example, the first source/drain region 107a is shared by two adjacent transistors, and the second source/drain region 107b is not shared by the two adjacent transistors. As illustrated, the first source/drain region 107a, and the second source/drain region 107b may be formed to partially overlap with the gate electrode G.

Figure 18:
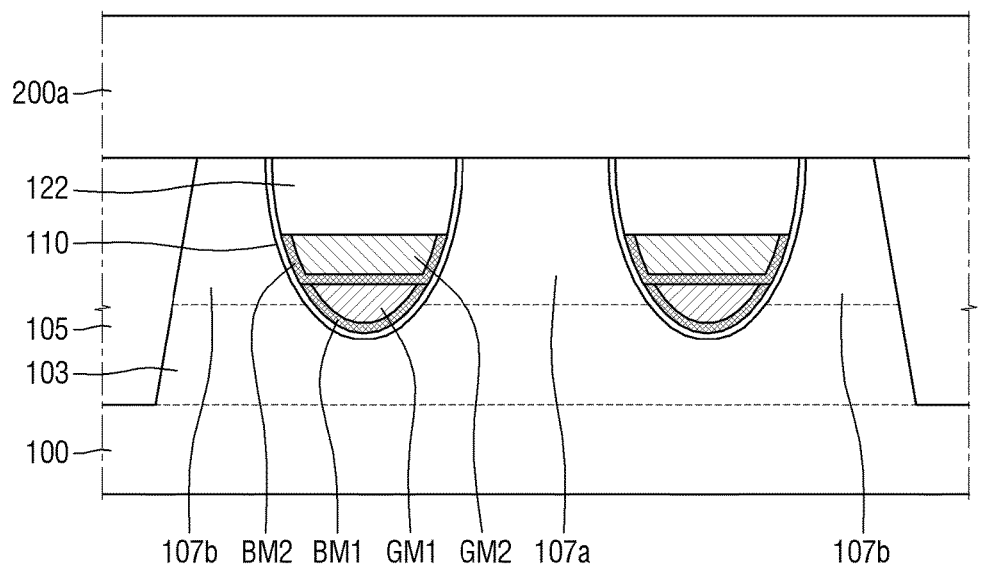

Next, referring to FIG. 18, the first interlayer insulating film 200a is formed on the upper surface of the substrate 100.

For example, the first interlayer insulating film 200a may include at least one of silicon oxide, silicon nitride and silicon oxynitride. The first interlayer insulating film 200a may be a single layer or multi-layers.

Figure 19:
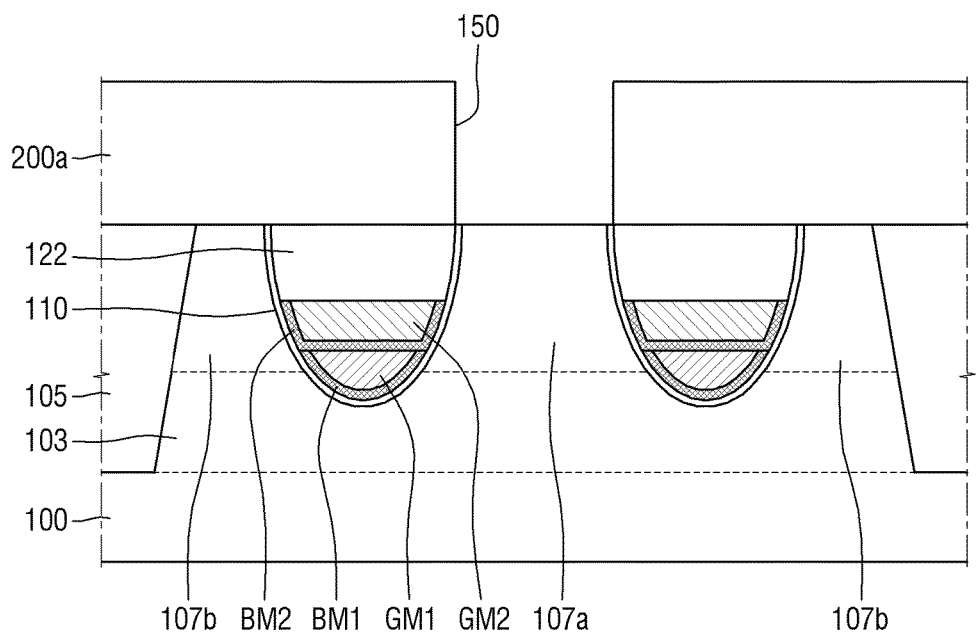

Next, referring to FIGS. 1 and 19, the first contact hole 150 for exposing the first source/drain region 107*a* is formed in the first interlayer insulating film 200*a*.

The first contact hole 150 may be formed in the first contact region DC of FIG. 1. Referring to FIG. 19, the first contact hole 150 is illustrated as entirely exposing the first source/drain region 107*a*, although example embodiments are not limited thereto.

Figure 20:
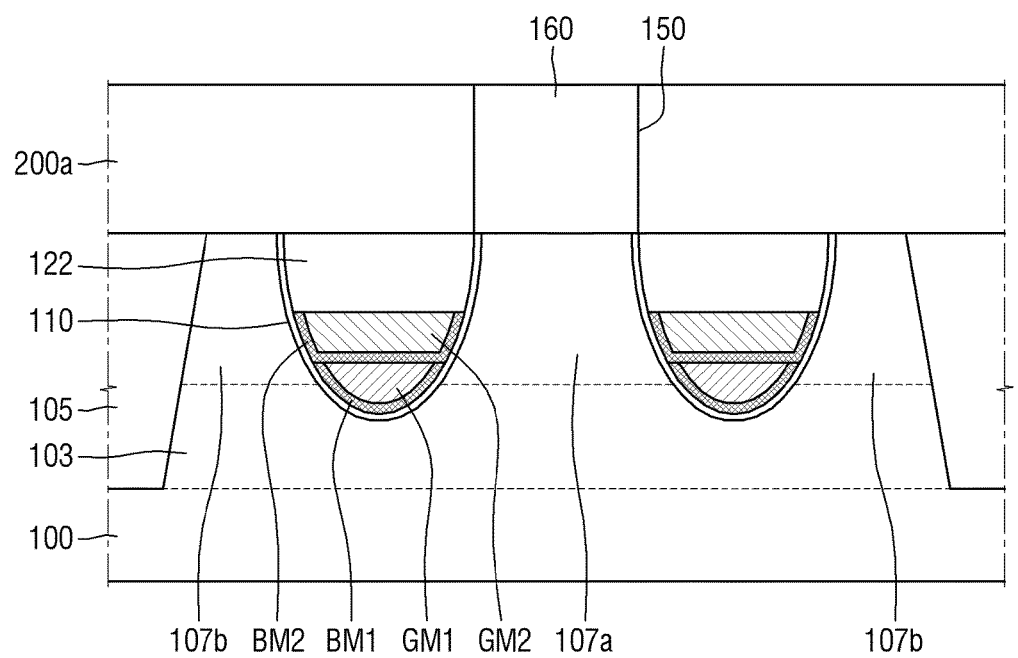

Next, referring to FIG. 20, a bit line contact 160 is formed in the first contact hole 150.

The bit line contact 160 may include a conductive material such as at least one of polysilicon, metal silicide compound, conductive metal nitride, and metal, for example, although example embodiments are not limited thereto.

Figure 21:
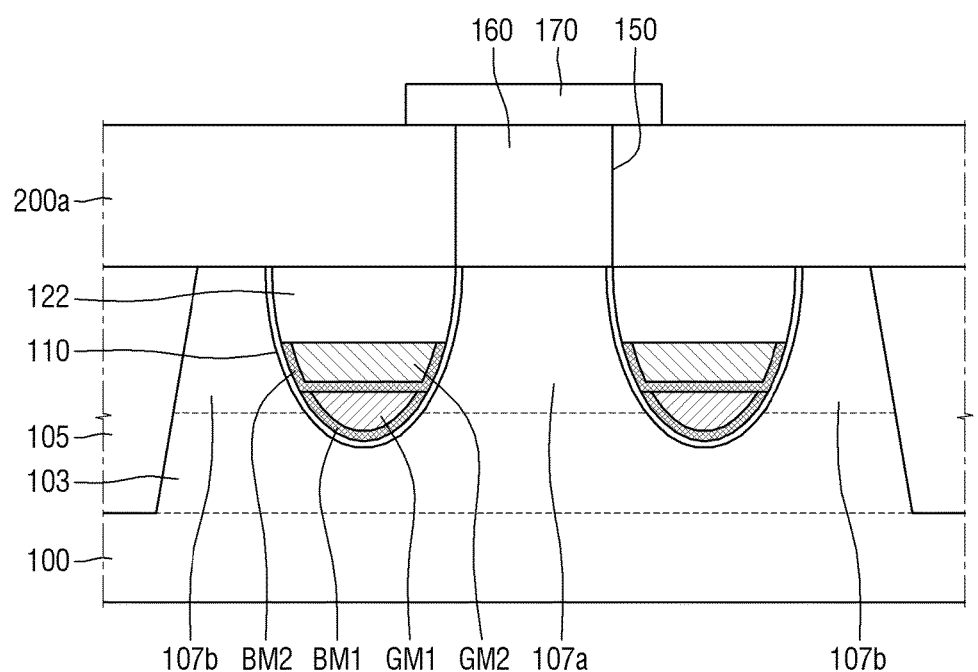

Next, referring to FIGS. 1 and 21, the bit line 170 is formed on the bit line contact 160, while being electrically connected with the bit line contact 160.

The bit line 170 may include a conductive material such as at least one of polysilicon, metal silicide compound, conductive metal nitride, and metal, for example, although example embodiments are not limited thereto. The bit line 170 ('BL' in FIG. 1) may be formed in a direction of intersecting the word line WL in FIG. 1.

Figure 22:
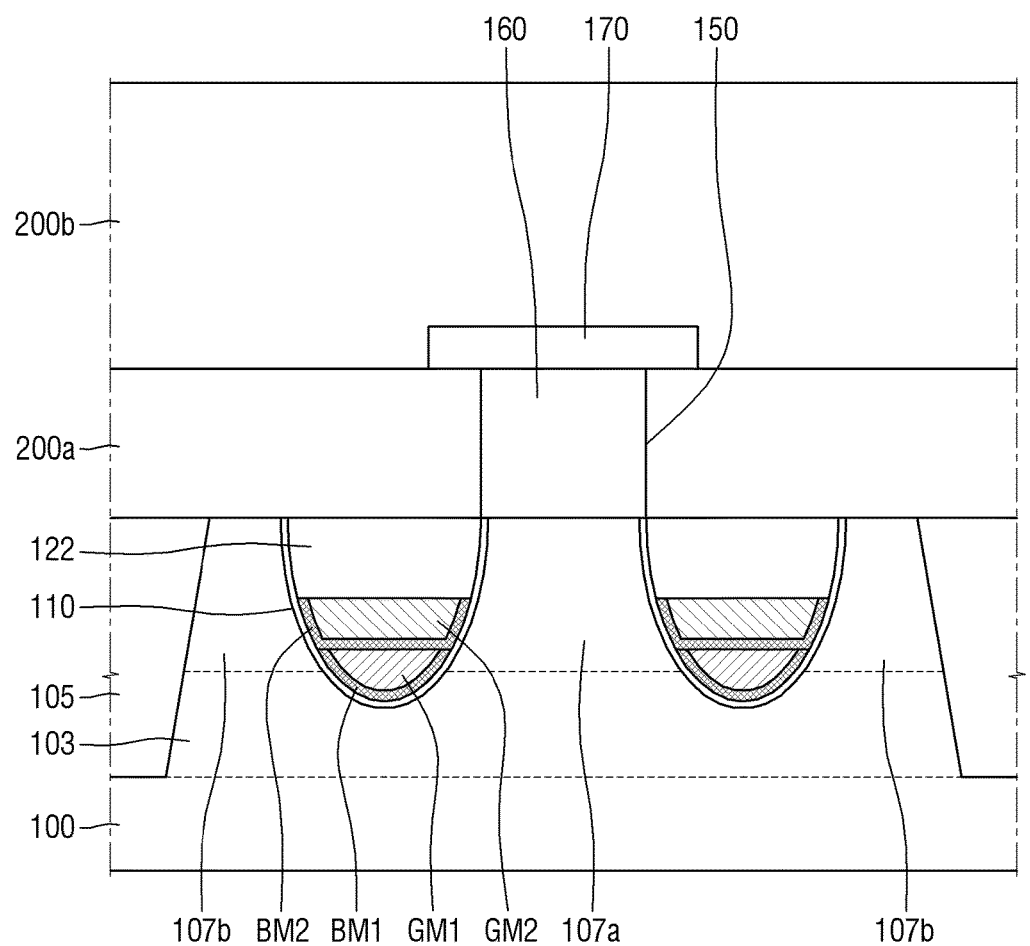

Next, referring to FIG. 22, the second interlayer insulating film 200*b* is formed on the first interlayer insulating film 200*a*.

The second interlayer insulating film 200*b* may overlie the bit line 170. Accordingly, the bit line 170 may be insulated.

For example, the second interlayer insulating film 200*b* may include at least one of silicon oxide, silicon nitride and silicon oxynitride. The second interlayer insulating film 200*b* may be a single layer or multi-layers.

Figure 23:
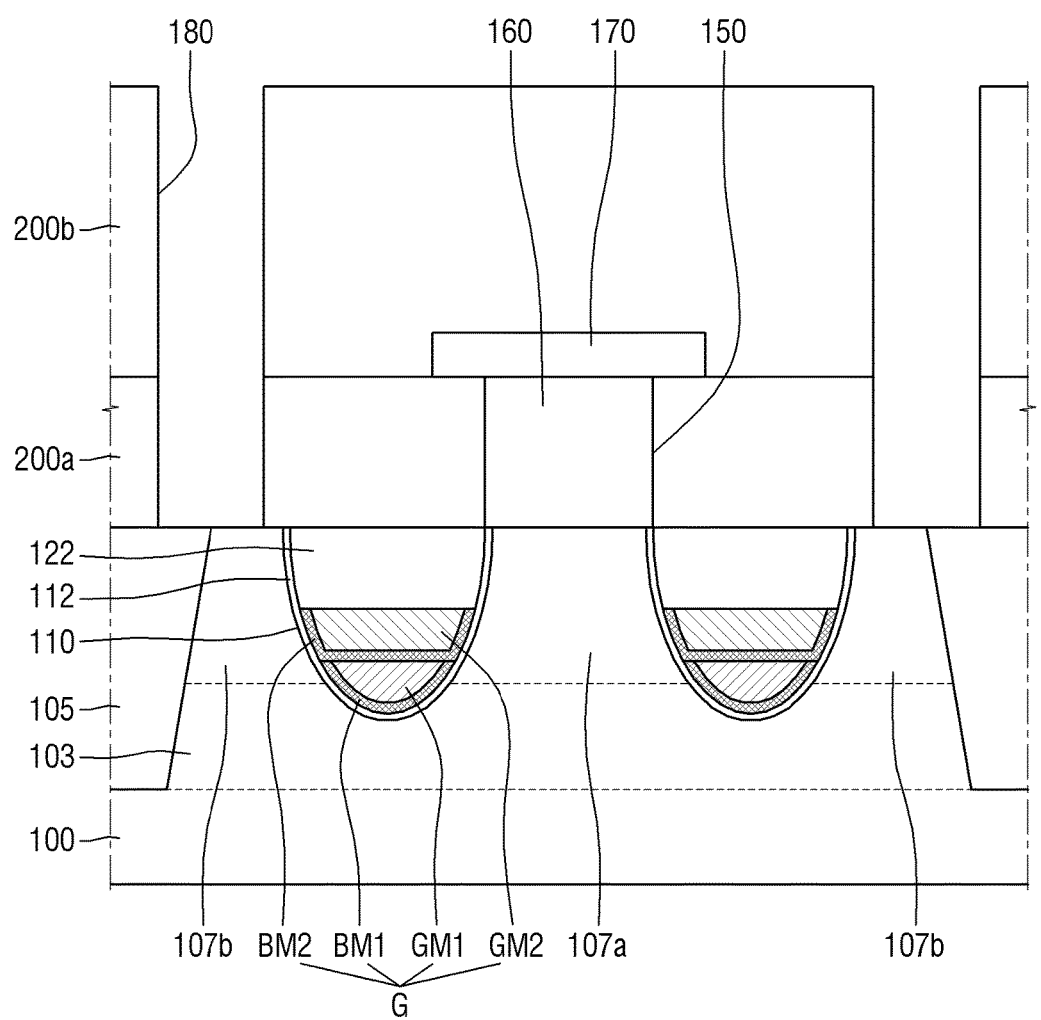

Next, referring to FIG. 23, the second contact hole 180 is formed in the first interlayer insulating film 200*a* and the second interlayer insulating film 200*b*, while being passed through the first interlayer insulating film 200*a* and the second interlayer insulating film 200*b*.

The second contact hole 180 is passed through the first interlayer insulating film 200*a* and the second interlayer insulating film 200*b*, thus exposes the second source/drain region 107*b*.

Next, referring to FIGS. 1 and 2, a storage node contact 190 is formed in the second contact hole 180.

The storage node contact 190 may be electrically connected with the second source/drain region 107*b*. The storage node contact 190 may include a conductive material such as at least one of polysilicon, metal silicide compound, conductive metal nitride, and metal, for example, although example embodiments are not limited thereto.

With a method for fabricating a semiconductor device according to some example embodiments, it is possible to reduce the leakage current by substituting the upper portion of the gate electrode G close to the BC node with the upper gate metal GM2 having properties of low effective work function, and also maintain the lower gate metal GM1 to be low to thus realize the word lines WL of lower resistance.

Inventive concepts are not limited as above. For example, further embodiments may involve forming a third barrier metal on the second barrier metal, and forming a third gate metal using the first gas, or another gas, prior to forming the capping layer. Further gate metals may be formed, and such descriptions are omitted as is obvious to one of skill in the art.

What is claimed is:

1. A method for fabricating a semiconductor device, comprising:
   forming a trench in a substrate;
   forming a lower gate metal using a first gas, the lower gate metal being recessed, burying at least a portion of the trench;
   forming a barrier material on the lower gate metal;
   on the barrier material, forming an upper gate metal using a second gas substantially different from the first gas; and
   forming a capping film on the gate metal, the capping film filling the trench,
   wherein an effective work function of the upper gate metal is less than an effective work function of the lower gate metal.

2. The method of claim 1, wherein forming the lower gate metal includes
   forming a lower gate thin film using the first gas, and
   growing the lower gate metal on the lower gate thin film using a third gas different from the first gas.

3. The method of claim 2, wherein forming the lower gate metal includes allowing a gate metal precursor to react with the first gas and the third gas, and
   a reactivity between the gate metal precursor and the first gas is greater than a reactivity between the gate metal precursor and the third gas.

4. The method of claim 3, wherein forming an upper gate metal includes forming an upper gate film using the second gas, and
   growing the upper gate metal on the upper gate film using the third gas,
   wherein the third gas is different from the second gas.

5. The method of claim 3, wherein the gate metal precursor includes at least one of $WF_6$ and $WCl_6$ and the third gas includes $H_2$.

6. The method of claim 1, wherein a resistivity of the upper gate metal is greater than a resistivity of the lower gate metal.

7. The method of claim 1, wherein the lower gate metal and the upper gate metal comprise tungsten.

8. The method of claim 1, wherein the first gas includes $B_2H_6$, and the second gas includes $SiH_4$.

9. The method of claim 1, wherein forming the lower gate metal includes
   forming a lower barrier material conformally along a bottom surface and a side surface of the trench, and
   forming the lower gate metal on the lower barrier material.

10. A method for fabricating a semiconductor device, comprising:
    forming a device isolation film for defining an active region in a substrate;
    forming a trench in the active region;
    forming a gate electrode to bury a portion of the trench, the gate electrode including a lower gate metal, a barrier material, and an upper gate metal;
    on the gate electrode, forming a capping film for filling the trench; and
    forming a source/drain region in at least one side of the trench,
    wherein forming the gate electrode includes,
       forming a lower gate metal, by using $B_2H_6$ gas,
       forming a barrier material on the lower gate metal, and
       forming an upper gate metal on the barrier material, by using $SiH_4$ gas.

11. The method of claim 10, further comprising:
forming a contact electrically connected with the source/drain region,
wherein a distance between the contact and the lower gate metal is greater than a distance between the contact and the upper gate metal.

12. The method of claim 10, wherein forming the gate electrode comprises:
forming a lower barrier material along a portion of a sidewall, and a bottom surface of the trench; and
forming a lower gate metal on the lower barrier material,
wherein the lower barrier material and the barrier material comprise a same first material.

13. The method of claim 12, wherein the first material includes at least one of TiN, TaN, Ti, Ta, Mo and Al.

14. The method of claim 10, wherein forming the gate electrode includes:
forming a gate insulating film that is conformally formed along a bottom surface and a side surface of the trench; and
on the gate insulating film, forming a gate electrode that fills a portion of the trench.

15. A method for fabricating a semiconductor device on a substrate, comprising:
forming a lower barrier material on a trench of the substrate;
forming a lower gate metal on the lower barrier material using a first gas including $B_2H_6$;
forming an upper barrier material on the lower gate metal; and
on the upper barrier material, forming an upper gate metal using a second gas different from the first gas, the second gas including $SiH_4$.

16. The method of claim 15, wherein
the substrate has an upper surface,
the lower barrier material has an upper surface,
the lower gate metal has an upper surface
the upper surface of the lower barrier material is lower than the upper surface of the substrate, and
the upper surface of the lower gate metal is lower than the upper surface of the substrate.

17. The method of claim 15, wherein the forming the lower barrier material and the forming the lower gate metal includes,
etching back a first barrier material film and a lower gate material film.

18. The method of claim 15, wherein the substrate includes an insulating layer on the trench, the insulating layer including an upper surface, and wherein the forming the upper barrier material includes,
conformally forming the upper barrier metal along the upper surface of the insulating layer and along the upper surface of the lower barrier material.

19. The method of claim 15, wherein the upper barrier material includes at least one of TiN, TaN, Ti, Ta, Mo, and Al.

20. The method of claim 15, wherein a resistivity of the upper gate metal is greater than a resistivity of the lower gate metal.

* * * * *